(12) United States Patent  
Bakker

(10) Patent No.: US 7,235,801 B2  
(45) Date of Patent: Jun. 26, 2007

(54) GRAZING INCIDENCE MIRROR, LITHOGRAPHIC APPARATUS INCLUDING A GRAZING INCIDENCE MIRROR, METHOD FOR PROVIDING A GRAZING INCIDENCE MIRROR, METHOD FOR ENHANCING EUV REFLECTION OF A GRAZING INCIDENCE MIRROR, DEVICE MANUFACTURING METHOD AND DEVICE MANUFACTURED THEREBY

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 155 days.

(21) Appl. No.: 10/860,656

(22) Filed: Jun. 4, 2004

(65) Prior Publication Data

US 2005/0279951 A1    Dec. 22, 2005

(51) Int. Cl.
*G21K 5/00* (2006.01)
*G02B 5/28* (2006.01)

(52) U.S. Cl. .................. 250/504 R; 378/34; 378/35; 427/523; 428/141

(58) Field of Classification Search ............. 250/492.1
See application file for complete search history.

(56) References Cited

U.S. PATENT DOCUMENTS 5,433,988 A * 7/1995 Fukuda et al. ............... 428/141
6,159,558 A * 12/2000 Wolfe et al. ................. 427/523
6,522,716 B1 * 2/2003 Murakami et al. ............ 378/34

* cited by examiner

*Primary Examiner*—David A. Vanore
(74) *Attorney, Agent, or Firm*—Pillsbury Winthrop Shaw Pittman LLP

(57) ABSTRACT

A grazing incidence mirror includes a mirror substrate and a mirror surface layer, the mirror surface layer including a first layer and a second layer, the first layer being positioned between the mirror substrate and the second layer. The first layer includes a material selected from the group of Mo, Nb and combinations thereof, and the second layer includes a material selected from the group of B, C, $B_4C$, SiC and combinations thereof. Such a grazing incidence mirror can be used in lithographic apparatus and in device manufacturing methods and provides a reflectivity that may be larger than state of the art grazing incidence mirrors based on Ru.

47 Claims, 5 Drawing Sheets

GRAZING INCIDENCE MIRROR, LITHOGRAPHIC APPARATUS INCLUDING A GRAZING INCIDENCE MIRROR, METHOD FOR PROVIDING A GRAZING INCIDENCE MIRROR, METHOD FOR ENHANCING EUV REFLECTION OF A GRAZING INCIDENCE MIRROR, DEVICE MANUFACTURING METHOD AND DEVICE MANUFACTURED THEREBY

BACKGROUND OF THE INVENTION

1. Field of the Invention

The present invention relates to a grazing incidence mirror, a lithographic apparatus including such a grazing incidence mirror, a method for providing such a grazing incidence mirror and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which may be referred to as a mask or a reticle, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the projection beam in a given direction (the "scanning" direction) while synchronously scanning the substrate parallel or anti-parallel to this direction.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, for example around 13 nm. Such radiation is termed extreme ultraviolet (EUV) or soft x-ray, and possible sources include, for example, laser-produced plasma sources, discharge plasma sources, or synchrotron radiation from electron storage rings.

Optical systems like lithographic apparatus may include grazing incidence mirrors, which have a mirror surface layer of ruthenium. These grazing incidence mirrors may, however, lead to a large loss in reflectivity and of the desired radiation. Reflectivities at EUV wavelengths are already low compared to reflectors at longer wavelengths which is a particular problem since a typical EUV lithographic system may have several mirrors. For example, a EUV lithographic system may have nine mirrors: two in the illumination optics, six in the imaging optics plus the reflecting mask. It is therefore evident that even a small decrease of 1–2% in the peak reflectivity of a single mirror will cause a significant light throughput reduction in the optical system.

SUMMARY OF THE INVENTION

It is an aspect of the present invention to provide a grazing incidence mirror with good reflectivity, comparable or higher than grazing incidence mirrors of the state of the art, which are based on ruthenium. It is another aspect to provide a lithographic apparatus including such a grazing incidence mirror. It is a further aspect to provide a method for providing such a grazing incidence mirror. It is yet a further aspect to provide a method for enhancing EUV reflection of a grazing incidence mirror. It is yet another aspect to provide a device manufacturing method, wherein a grazing incidence mirror according to the present invention is used.

According to a first aspect of the present invention, a grazing incidence mirror includes a mirror substrate and a mirror surface layer, the mirror surface layer including at least a first layer and a second layer, the first layer being positioned between the mirror substrate and the second layer, wherein the first layer includes a material selected from the group of Mo, Nb, and combinations thereof, and the second layer includes a material selected from the group of B, C, $B_4C$, SiC and combinations thereof.

In a second aspect of the present invention, a lithographic apparatus includes an illumination system configured to provide a beam of radiation; a support configured to support a patterning device, the patterning device configured to impart the beam with a pattern in its cross-section; a substrate table configured to hold a substrate; a projection system configured to project the patterned beam onto a target portion of the substrate; and a grazing incidence mirror, the grazing incidence mirror including a mirror substrate and a mirror surface layer, the mirror surface layer including at least a first layer and a second layer, the first layer being positioned between the mirror substrate and the second layer, wherein the first layer includes a material selected from the group of Mo, Nb and a combinations thereof, and the second layer includes a material selected from the group of B, C, $B_4C$, SiC and combinations thereof.

A grazing incidence mirror according to the present invention provides enhanced EUV reflection with respect to state of the art grazing incidence mirrors, which are based on Ru (ruthenium) and which have a Ru layer as mirror surface layer. When using the grazing incidence mirror of the present invention in a lithographic apparatus, relatively more useful or desired radiation, especially EUV radiation, is reflected, thereby leading to less loss of desired radiation.

The grazing incidence mirror of the present invention may also be used in a device manufacturing method. In a further aspect of the present invention, a device manufacturing method includes projecting a patterned beam of radiation onto a target portion of a substrate and providing a grazing incidence mirror according to the present invention. By using such a method, less desired radiation, especially EUV radiation, is lost when manufacturing devices, thereby providing a higher output.

In a further aspect of the present invention, a method for providing a grazing incidence mirror includes providing a mirror substrate; providing a first layer on the mirror substrate, wherein the first layer includes a material selected from the group of Mo, Nb and combinations thereof; and providing a second layer on the first layer, wherein the second layer includes a material selected from the group of B, C, $B_4C$, SiC and combinations thereof.

In another aspect of the present invention, a method for enhancing EUV reflection of a grazing incidence mirror includes providing at least one grazing incidence mirror according to the invention. The grazing incidence mirror cannot only be used in a lithographic apparatus, but also in other optical apparatus wherein EUV radiation is applied and a grazing incidence mirror is used. When using such a grazing incidence mirror, less desired radiation is lost, thereby enhancing the output and/or throughput of such apparatus.

According to yet another aspect of the present invention, a device is manufactured according to the device manufacturing method of the present invention or with the lithographic apparatus according to the present invention.

According to an embodiment of the present invention, a grazing incidence mirror includes a first layer having a thickness of at least 5 nm. According to another embodiment, the first layer has a thickness between 10–100 nm. Such layer thicknesses provide good mirroring properties to the grazing incidence mirrors of the present invention.

The first layer is on a substrate, which mounts the mirroring layers. A stack is formed of a mirror substrate, the first layer and a second layer. According to an embodiment, the second layer has a thickness greater than 0 nm and equal to or less than 10 nm. According to another embodiment, the second layer has a thickness between 0.1–5 nm. According to yet another embodiment, the second layer has a thickness between 0.5–3 nm. According to a still further embodiment, the second layer has a thickness between 1–2.5 nm, for example 1.5–2.5 nm.

In another embodiment, the second layer includes $B_4C$, having a thickness of about 0.5–3 nm, for example 1.5–2.5 nm $B_4C$. In yet another embodiment, the second layer includes B having a thickness of about 0.5–3 nm, for example 1.5–2.5 nm B. In a still further embodiment, the second layer includes SiC having a thickness of about 0.5–3 nm, for example 1.5–2.5 nm SiC. In still yet another embodiment, the second layer includes C having a thickness of about 0.5–3 nm, for example 1.5–2.5 nm C.

In another embodiment, the first layer or the second layer or both layers include combinations of materials. For example, the first layer may include a combination of Mo (molybdenum) and Nb (niobium), and the second layer may include a combination of B (boron) and C (carbon), for example $B_4C$. In yet another embodiment, the layers may include more than one layer, e.g. the second layer includes two or more layers, each layer including a material selected from the group consisting B, C, $B_4C$, SiC and combinations thereof.

The embodiments described above relate to grazing incidence mirrors according to the present invention, but also to embodiments wherein grazing incidence mirrors of the present invention are used, for example in a lithographic apparatus, or in a device manufacturing method according to the present invention, or in a method to enhance EUV radiation according to the present invention.

Lithographic apparatus are known in the art, and may include one or more grazing incidence mirrors according to the invention.

In an embodiment of the present invention, a lithographic apparatus includes an illumination system configured to provide a beam of radiation; a support configured to support a patterning device, the patterning device configured to impart the beam with a pattern in its cross-section; a substrate table configured to hold a substrate; a projection system configured to project the patterned beam onto a target portion of the substrate; and a grazing incidence mirror, the grazing incidence mirror including a mirror substrate and a mirror surface layer, the mirror surface layer including at least a first layer and a second layer, the first layer being positioned between the mirror substrate and the second layer, wherein the first layer includes a material selected from the group consisting Mo, Nb and combinations thereof, and the second layer includes a material selected from the group of B, C, $B_4C$, SiC and combinations thereof.

In another embodiment, a lithographic apparatus includes a collector mirror, wherein the collector mirror includes a grazing incidence mirror according to the present invention. In another embodiment, the illumination system includes a grazing incidence mirror according to the present invention.

In a further embodiment of the present invention, a device manufacturing method includes projecting a patterned beam of radiation onto a target portion of a substrate and providing a grazing incidence mirror according to the present invention.

In yet a further embodiment of the present invention, a method for enhancing EUV reflection of a grazing incidence mirror includes providing a grazing incidence mirror according to the present invention.

In a further embodiment, a device manufacturing method or a method for enhancing the EUV reflection of a grazing incidence mirror, wherein a beam of radiation is provided, includes reflecting at a grazing incidence mirror with a grazing incidence angle α, wherein a is larger than 0° but equal to or smaller than 21°. A desired combination of grazing incidence angle, material of the second layer and layer thickness can be selected. For example, by selecting specific combinations of these parameters, the increase in reflection with respect to state of the art grazing incidence mirrors based on Ru can be larger than 2%, or even larger than 4%. Consequently, in an embodiment of a lithographic apparatus according to the present invention, wherein the apparatus includes at least one grazing incidence mirror, the grazing incidence mirror may be positioned such that a beam of radiation has a grazing incidence angle α with the grazing incidence mirror, wherein a is larger than 0° but equal to or smaller than 21°. These embodiments are especially applicable to a grazing incidence mirror according to the present invention wherein the first layer includes Mo.

In a further embodiment, a device manufacturing method, or a method for enhancing the EUV reflection of a grazing incidence mirror, wherein a beam of radiation is provided, includes reflecting at a grazing incidence mirror with a grazing incidence angle α, wherein a is larger than 0° but equal to or smaller than 17°. A desired combination of grazing incidence angle, material of the second layer and layer thickness can be selected. For example, by selecting specific combinations of these parameters, the increase in reflection with respect to state of the art grazing incidence mirrors based on Ru can be larger than 2%, or even larger than 4%. Consequently, in an embodiment of a lithographic apparatus according to the present invention, wherein the apparatus includes at least one grazing incidence mirror, the grazing incidence mirror may be positioned such that a beam of radiation has a grazing incidence angle α with the grazing incidence mirror, wherein α is larger than 0° but equal to or smaller than 17°. These embodiments are especially applicable to a grazing incidence mirror according to the invention wherein the first layer includes Nb.

In yet another embodiment, a device manufacturing method includes providing a radiation system and providing a collector mirror in the radiation system, wherein the collector mirror includes a grazing incidence mirror according to the present invention. In another embodiment, the method includes providing an illumination system, wherein the illumination system includes a grazing incidence mirror according to the present invention.

As mentioned above, the present invention is also directed to a method for providing the grazing incidence mirror. In an embodiment of the method for providing the grazing incidence mirror of the invention the first and second layers are provided by a method selected from the group of electron beam evaporation, chemical vapor deposition and sputtering. Other methods can be used to provide the first and second layers.

The present invention is also directed to a grazing incidence mirror, and the use of such grazing incidence mirror in the methods of the invention, wherein the mirror substrate of the grazing incidence mirror includes the first layer. The first layer is used as substrate (or the substrate as first layer). The thickness of the mirror substrate, the mirror substrate including a material selected from the group of Mo, Nb and combinations thereof, can be selected and may vary depending upon the application.

In the context of the invention, "optical system" or "optical apparatus" may include a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams. Herein, "undesired radiation" or "undesired wavelength" refers to radiation having wavelengths larger or smaller than the wavelength that is intended to be used. For example, when EUV radiation with a wavelength $\lambda$ of about 13.5 nm is desired, radiation with a wavelength smaller than about 10 nm or larger than about 20 nm is undesired. More specifically, radiation not having wavelengths in the range of about 13.5 nm+/−2% may generally be considered undesired radiation. It should be appreciated that the phrase "radiation with wavelength $\lambda$" is not intended to be limited to radiation with an infinite small bandwidth of $\lambda$. An optical element, especially a grazing incidence mirror, may be designed for one specific wavelength $\lambda$ or a range of wavelengths, e.g. for radiation with a predefined in-band wavelength in the range of about 12–14 nm.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

The support structure supports, e.g. bares the weight of, the patterning device. It holds the patterning device in a way depending on the orientation of the patterning device, the design of the lithographic apparatus, and other conditions, for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
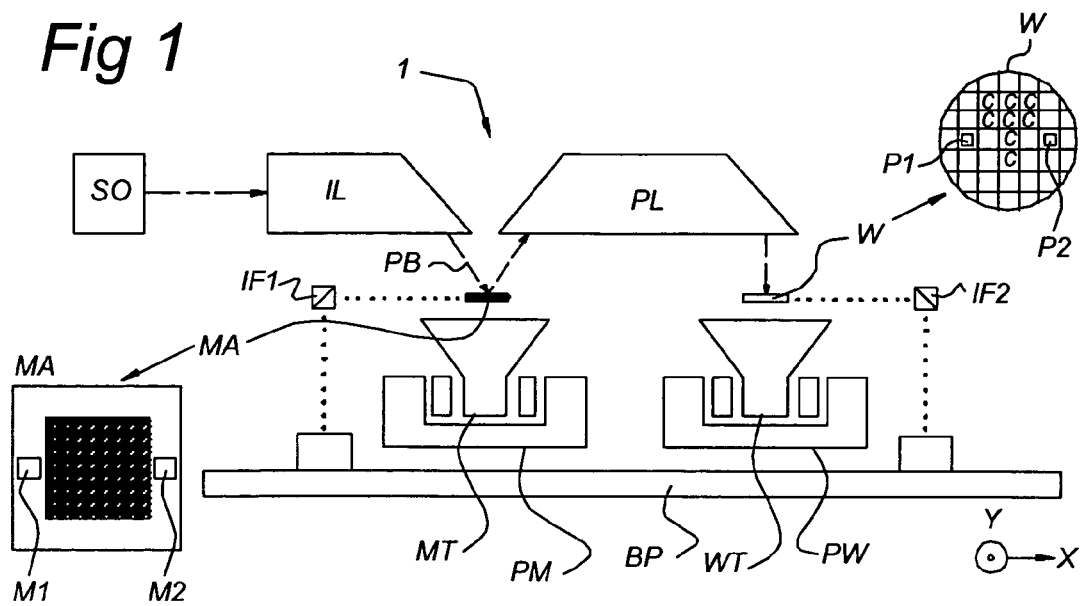
FIG. 1 schematically depicts a lithographic apparatus according to an embodiment of the invention.

FIG. 1 schematically depicts a lithographic apparatus 1 according to an embodiment of the present invention, including an illumination system (illuminator) IL configured to providing a beam PB of radiation (e.g. UV or EUV radiation). A first support (e.g. a mask table) MT supports a patterning device (e.g. a mask) MA and is connected to a first positioning device PM that accurately positions the patterning device with respect to a projection system ("lens") PL. A substrate table (e.g. a wafer table) WT holds a substrate (e.g. a resist-coated wafer) W and is connected to a second positioning device PW that accurately positions the substrate with respect to the projection system PL. The projection system (e.g. a reflective projection lens) PL images a pattern imparted to the beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector, including for example suitable collecting mirrors and/or a spectral purity filter. In other cases the source may be integral part of the apparatus, for example when the source is a mercury lamp. The source SO and the illuminator IL may be referred to as a radiation system.

The illuminator IL may include an adjusting device that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device) supported on a base plate BP, the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width in the non-scanning direction of the target portion in a single dynamic exposure, whereas the length of the scanning motion determines the height in the scanning direction of the target portion.

3. In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
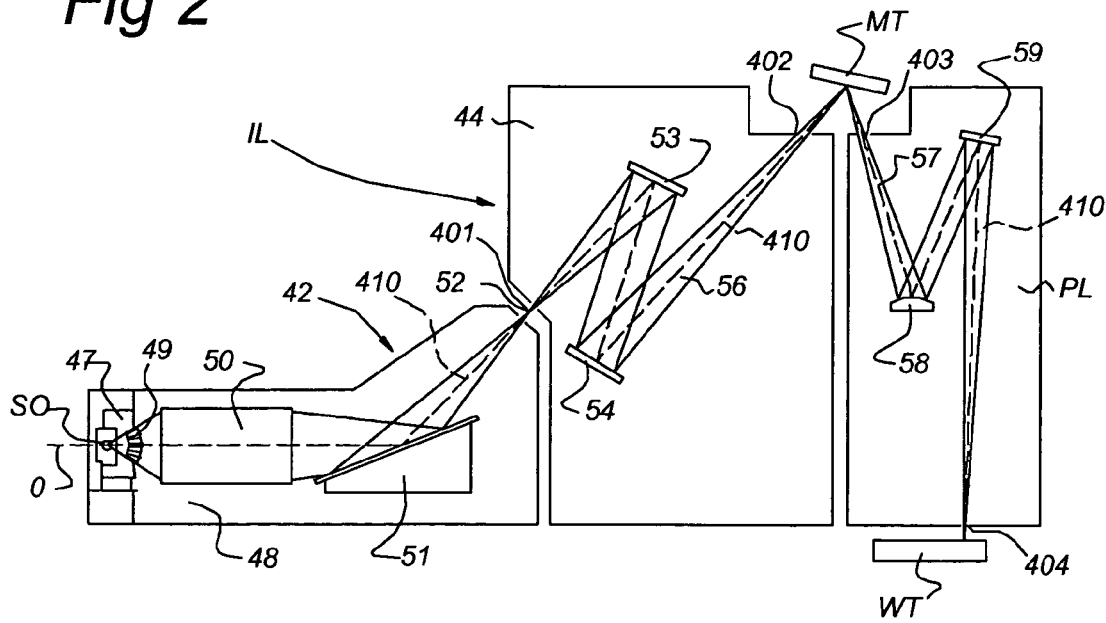
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PL. The radiation system 42 includes the radiation source SO which may be formed by a discharge plasma. EUV radiation may be produced by a gas or vapor, such as Xe gas or Li vapor in which a very hot plasma is created to emit radiation in the EUV range of the electromagnetic spectrum. The very hot plasma is created by causing a partially ionized plasma of an electrical discharge to collapse onto an optical axis O. Partial pressures of, for example, 10 Pa of Xe or Li vapor or any other suitable gas or vapor may be required for efficient generation of the radiation. The radiation emitted by radiation source SO is passed from a source chamber 47 into a collector chamber 48, for example via a gas barrier structure or contamination trap 49 which may be positioned in or behind an opening in the source chamber 47. The gas barrier structure 49 may include a channel structure, for example as described in European Patent Application Publications 1 057 079 and/or 1 223 468, which are incorporated herein by reference.

The collector chamber 48 includes a radiation collector 50 which may be formed by a grazing incidence collector. Radiation passed by the collector 50 is reflected off a grating spectral filter 51 to be focused in a virtual source point 52 at an aperture 401 in the collector chamber 48. From collector chamber 48, a beam 56 is reflected in the illumination optics unit 44 via normal incidence reflectors 53, 54 onto a reticle or mask positioned on the reticle or mask table MT. A patterned beam 57 is formed which is imaged in the projection system PL via reflective elements 58, 59 onto the wafer stage or substrate table WT. More elements than shown may generally be present in illumination optics unit 44 and projection system PL.

Figure 3A:
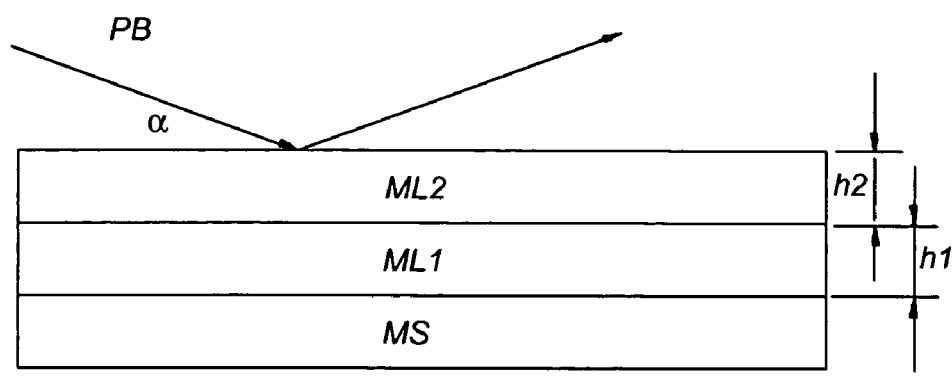
FIGS. 3a and 3b schematically depict side views of grazing incidence mirrors including a substrate, a first layer and a second layer (FIG. 3a) and a substrate (including a first layer) and a second layer (FIG. 3b)
Figure 3B:
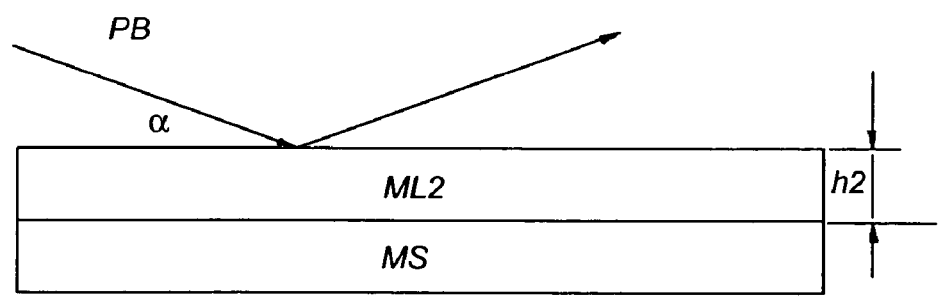

Referring to FIGS. 3a and 3b, grazing incidence mirrors according to the present invention are shown. As shown in FIG. 3a, a mirror substrate MS mounts a first layer as a mirroring layer ML1 and a second layer ML2. The first layer ML1 has a thickness or height h1 of 5–10 nm, and includes Nb, Mo or combinations thereof, and a second layer ML2, having a thickness or height h2 of 0.5–3 nm, for example 1.5–2.5 nm, and includes B, C, $B_4C$ or SiC.

Figure 4:
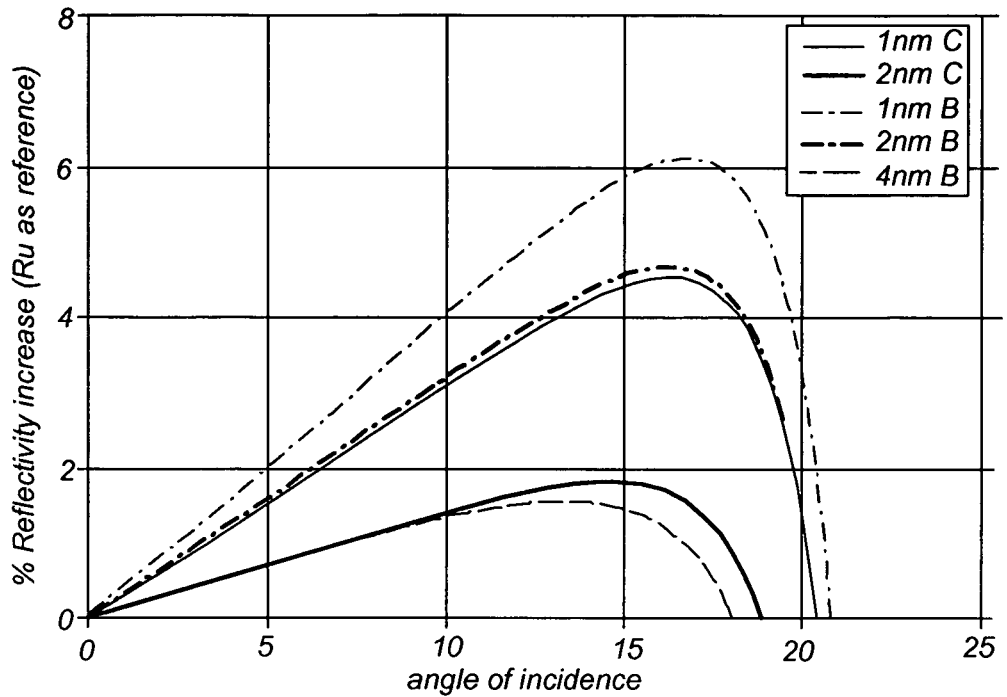
FIG. 4 schematically depicts the reflection of grazing incidence mirrors of the present invention with different second layers (B or C) and Mo as first layer.
Figure 5:
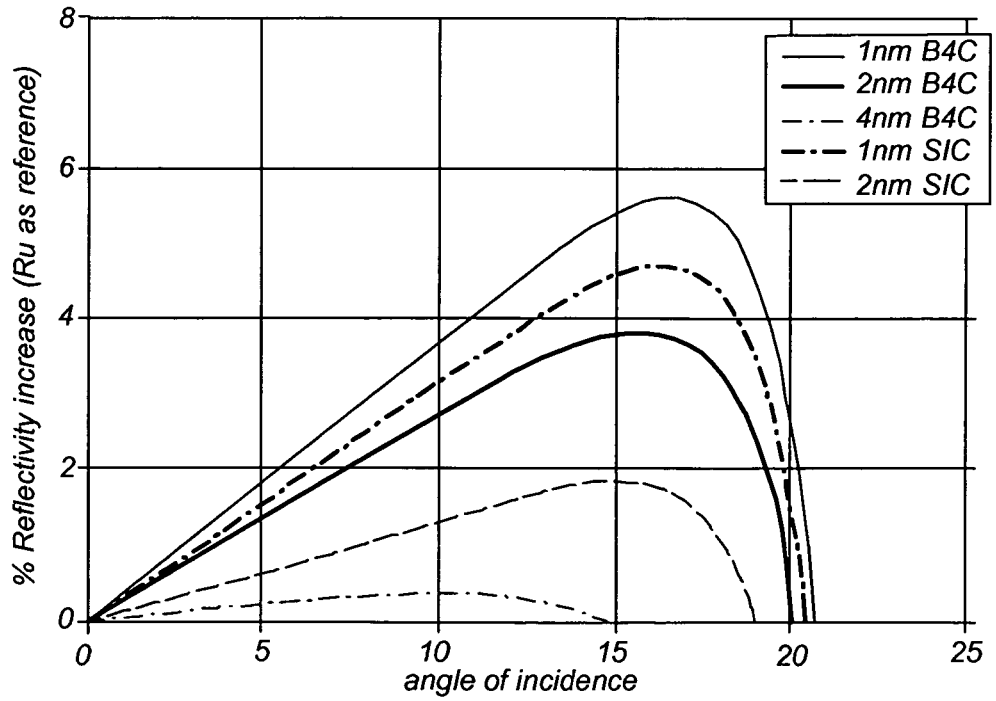
FIG. 5 schematically depicts the reflection of grazing incidence mirrors of the present invention with different second layers ($B_4C$ or SiC) and Mo as first layer.

Values for the increase of reflectivity in %, with respect to a state of the art grazing incidence mirror with a Ru layer, using EUV radiation of 13.5 nm, are shown in FIGS. 4 and 5.

The grazing incidence mirror of the invention may also be curved. This embodiment is also directed to the grazing incidence mirror with a layer structure of FIG. 3b.

In the lithographic apparatus 1, the radiation collector mirror 50 may include grazing incidence mirror according to the present invention. The illumination optics unit 44, the projection system PL, or both may also include a a grazing incidence mirror according to the present invention. The number of mirrors, the kind or mirrors and the position of mirrors in the radiation collector 50, the projection system PL and/or the illumination optics unit 44 may be determined according to the desired operating characteristics of the apparatus 1.

Referring again to FIG. 3a, a grazing incidence mirror includes a first layer ML1 having a thickness h1 of about 5–100 nm and including Mo or Nb or combinations thereof and a second layer ML2, having a thickness h2 of about 2 nm and including $B_4C$.

Referring again to FIG. 3b, a grazing incidence mirror includes a mirror substrate including Mo or Nb or combinations thereof. The second layer ML2 includes a material selected from the group of B, C, $B_4C$, SiC and combinations thereof, the second layer ML2 having a thickness h2 of about 0.5–3 nm, for example 2 nm. For example, this second layer includes $B_4C$. $B_4C$ on Mo or Nb leads to a large gain in reflectivity with respect to conventional Ru grazing incidence mirrors.

The first and second layers ML1 and ML2 of the grazing incidence mirror may be provided by a method selected from electron beam evaporation, chemical vapor deposition and sputtering. The growth of the layers, the control of the thickness of the layers, the material of the mirror substrate may be selected according to the desired characteristics of the grazing incidence mirror.

A grazing incidence mirror according to the present invention may be used, for example in a device manufacturing method, or in a method wherein EUV radiation and a grazing incidence mirror are used.

The angle of incidence α, as shown in FIGS. 4 and 5, will lead to different increases of reflectivities for the different materials that can be used as the second layer. In the table below EUV radiation of 13.5 and a grazing incidence mirror with a first layer ML1 of Mo are used. Wen varying the materials of the second layer ML2, and the layer thickness h2, the respective ranges of the grazing incidence angle α are given.

| Material (ML2) | Thickness h2 (nm) | Angle of incidence |
|---|---|---|
| B | 1 | 0–21 |
|   | 2 | 0–20 |
|   | 4 | 0–18 |
| C | 1 | 0–20 |
|   | 2 | 0–19 |
|   | 4 | — |
| SiC | 1 | 0–20 |
|   | 2 | 0–19 |
|   | 4 | — |
| $B_4C$ | 1 | 0–21 |
|   | 2 | 0–20 |
|   | 4 | 0–15 |

For example, when B is used with a thickness h2 of 1 nm, the grazing incidence angle will be larger than 0°, and equal to or smaller than 21°. As another example, when $B_4C$ is used with a thickness h2 of 4 nm, the grazing incidence angle will be larger than 0° and equal to or smaller than 15°. Based on FIGS. 4 and 5, other combinations of parameters (materials of the second layer ML2, the layer thickness h2, and the respective ranges of α) can be chosen, such that a large increase in reflectivity can be obtained.

A grazing incidence mirror according to the present invention may also be used, for example, in a device manufacturing method, or in another method, wherein EUV radiation and a grazing incidence mirror are used.

Figure 6:
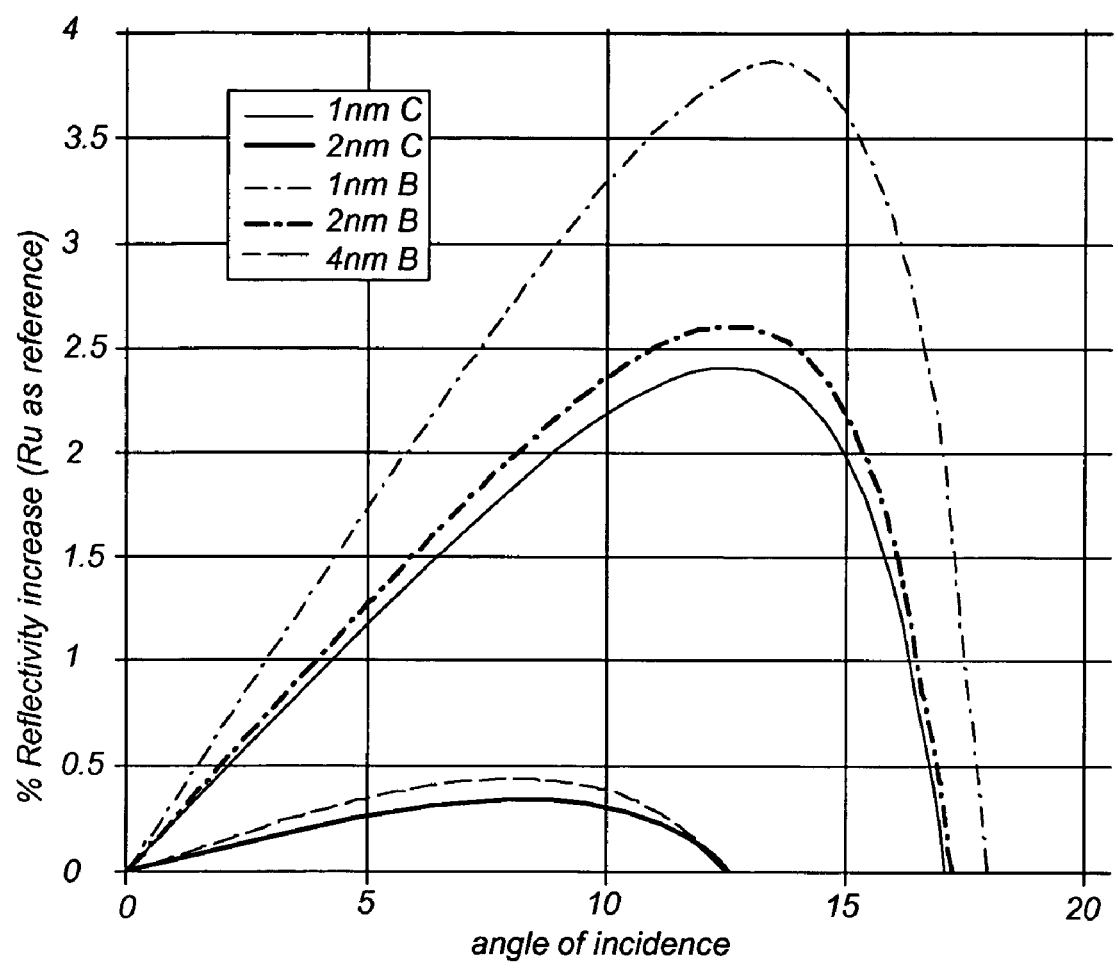
FIG. 6 schematically depicts the reflection of grazing incidence mirrors of the present invention with different second layers (B or C) and Nb as first layer.
Figure 7:
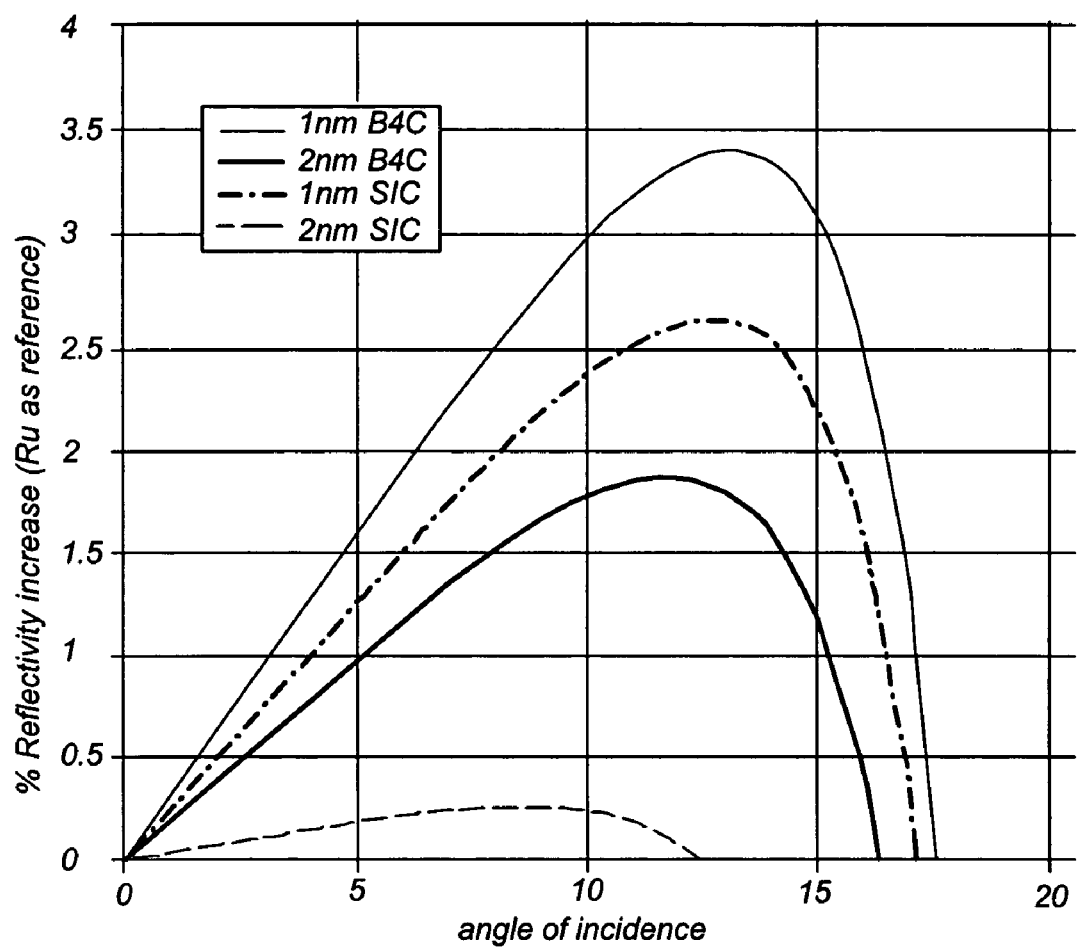
FIG. 7 schematically depicts the reflection of grazing incidence mirrors of the present invention with different second layers ($B_4C$ or SiC) and Nb as first layer.

The angel of incidence α, as shown in FIGS. 6 and 7, will lead to different increases of reflectivities for the different materials that can be used as the second layer. In the table below, EUV radiation of 13.5 and a grazing incidence mirror with a first layer ML1 of Nb are used. When varying the materials of the second layer ML2, and the thickness h2, the respective ranges of the grazing incidence angle α are given.

| Material | Thickness (nm) | Angle of incidence |
|---|---|---|
| B | 1 | 0–17 |
|   | 2 | 0–17 |
|   | 4 | 0–12 |
| C | 1 | 0–17 |
|   | 2 | 0–12 |
|   | 4 | — |
| SiC | 1 | 0–17 |
|   | 2 | 0–12 |
|   | 4 | — |
| $B_4C$ | 1 | 0–17 |
|   | 2 | 0–16 |
|   | 4 | — |

For example, when B is used with a thickness h2 of 1 nm, the grazing incidence angle will be larger than 0° and equal to or smaller than 17°. As another example, when $B_4C$ is used with a thickness h2 of 2 nm, the grazing incidence angle will be larger than 0° and equal to or smaller than 16°. Based on FIGS. 6 and 7, other combinations of parameters (materials of the second layer ML2, the layer thickness h2, and the respective ranges of a) can be chosen, such that a large increase in reflectivity can be obtained.

Some of the embodiments especially describe EUV (or soft X-ray) applications and EUV optical elements. However, the invention can also be applied to optical systems for other spectral ranges, like e.g. DUV, VUV, UV or VIS. The invention is not limited to application of the lithographic apparatus or use in the lithographic apparatus as described in the embodiments. Further, the drawings generally include the elements and features necessary to understand the invention. Beyond that, the drawings are schematic and not to scale. The invention is not limited to those elements, shown in the schematic drawings, for example the number of mirrors shown. Additionally, the invention is not limited to the lithographic apparatus as described. It should be appreciated that embodiments described above may be combined.

What is claimed is:

1. A grazing incidence mirror, comprising:
   a mirror substrate; and
   a mirror surface layer, the mirror surface layer comprising a first layer and a second layer, the first layer being positioned between the mirror substrate and the second layer, wherein the first layer comprises a material selected from the group of Mo, Nb and combinations thereof, and the second layer comprises a material selected from the group of B, C, B$_4$C, SiC and combinations thereof, the mirror surface layer being configured to reflect radiation at a grazing incidence angle of greater than 0° but eciual to or less than about 21°.

2. A grazing incidence mirror according to claim 1, wherein the first layer has a thickness of at least about 5 nm.

3. A grazing incidence mirror according to claim 1, wherein the first layer has a thickness between about 10–100 nm.

4. A grazing incidence mirror according to claim 1, wherein the mirror substrate comprises the first layer.

5. A grazing incidence mirror according to claim 1, wherein the second layer has a thickness larger than 0 nm and equal to or less than about 10 nm.

6. A grazing incidence mirror according to claim 1, wherein the second layer has a layer thickness between about 0.1–5 nm.

7. A grazing incidence mirror according to claim 1, wherein the second layer has a layer thickness between about 0.5–3 nm.

8. A grazing incidence mirror according to claim 1, wherein the second layer comprises B$_4$C.

9. A lithographic apparatus comprising a grazing incidence mirror, the grazing incidence mirror comprising a mirror substrate and a mirror surface layer, the mirror surface layer comprising a first layer and a second layer, the first layer being positioned between the mirror substrate and the second layer, wherein the first layer comprises a material selected from the group of Mo, Nb and combinations thereof, and the second layer comprises a material selected from the group of B, C, B$_4$C, SiC and combinations thereof, the grazing incidence mirror being configured to reflect radiation at a grazing incidence angle of greater than 0° but equal to or less than about 21°.

10. A lithographic apparatus, comprising:
    an illumination system configured to condition a beam of radiation;
    a support configured to support a patterning device, the patterning device configured to impart the beam with a pattern in its cross-section;
    a substrate table configured to hold a substrate;
    a projection system configured to project the patterned beam of radiation onto a target portion of the substrate; and
    a grazing incidence mirror, the grazing incidence mirror comprising a mirror substrate and a mirror surface layer, the mirror surface layer comprising a first layer and a second layer, the first layer being positioned between the mirror substrate and the second layer, wherein the first layer comprises a material selected from the group of Mo, Nb and combinations thereof, and the second layer includes a material selected from the group of B, C, B$_4$C, SiC and combinations thereof, the mirror surface layer being configured to reflect the beam of radiation or the patterned beam of radiation at a grazing incidence angle of greater than 0° but eciual to or less than about 21°.

11. A lithographic apparatus according to claim 10, further comprising: a collector mirror, wherein the collector mirror comprises the grazing incidence mirror.

12. A lithographic apparatus according to claim 10, wherein the illumination system comprises the grazing incidence mirror.

13. A lithographic apparatus according to claim 10, wherein the first layer has a thickness of at least about 5 nm.

14. A lithographic apparatus according to claim 10, wherein the first layer has a thickness between about 10–100 nm.

15. A lithographic apparatus according to claim 10, wherein the mirror substrate comprises the first layer.

16. A lithographic apparatus according to claim 10, wherein the second layer has a thickness larger than 0 nm and equal to or less than about 10 nm.

17. A lithographic apparatus according to claim 10, wherein the second layer has a thickness between about 0.1–5 nm.

18. A lithographic apparatus according to claim 10, wherein the second layer has a thickness between about 0.5–3 nm.

19. A lithographic apparatus according to claim 10, wherein the second layer comprises B$_4$C.

20. A method for providing a grazing incidence mirror, comprising:
    providing a mirror substrate;
    providing a first layer on the mirror substrate, wherein the first layer comprises a material selected from the group of Mo, Nb and combinations thereof; and
    providing a second layer on the first layer, wherein the second layer comprises a material selected from the group of B, C, B$_4$C, SiC and combinations thereof,
    wherein the first layer and the second layer are configured to reflect radiation at a grazing incidence angle of greater than 0° but equal to or less than about 21°.

21. A method according to claim 20, wherein the first and second layer are provided by a method selected from electron beam evaporation, chemical vapor deposition or sputtering.

22. A method according to claim 20, wherein the mirror substrate comprises the first layer.

23. A device manufacturing method, comprising:
    patterning a beam of radiation;
    projecting the patterned beam of radiation onto a target portion of a substrate;

providing a grazing incidence mirror, the grazing incidence mirror comprising a mirror substrate and a mirror surface layer, the mirror surface layer comprising a first layer and a second layer, the first layer being positioned between the mirror substrate and the second layer, wherein the first layer comprises a material selected from the group of Mo, Nb and combinations thereof, and the second layer comprises a material selected from the group of B, C, $B_4C$, SiC and combinations thereof; and reflecting the beam of radiation or the patterned beam of radiation at the grazing incidence mirror with a grazing incidence angle greater than 0° but equal to or less than about 21°.

24. A method according to claim 23, further comprising: providing a radiation system; and providing a collector mirror in the radiation system, wherein the collector mirror comprises the grazing incidence mirror.

25. A method according to claim 24, wherein the radiation system comprises an illumination system and the illumination system comprises the grazing incidence mirror.

26. A method according to claim 23, wherein the mirror substrate comprises the first layer.

27. A method according to claim 23, wherein the first layer has a thickness of at least about 5 nm.

28. A method according to claim 23, wherein the first layer has a thickness between about 10–100 nm.

29. A method according to claim 23, wherein the second layer has a thickness greater than 0 nm and equal to or less than about 10 nm.

30. A method according to claim 23, wherein the second layer has a thickness between about 0.1–5 nm.

31. A method according to claim 23, wherein the second layer has a thickness between about 0.5–3 nm.

32. A method according to claim 23, wherein the second layer comprises $B_4C$.

33. A method according to claim 23, wherein the first layer comprises Mo.

34. A method according to claim 23, wherein the incidence angle is greater than 0° but equal to or less than about 17°.

35. A method according to claim 34, wherein the first layer comprises Nb.

36. A device manufactured according to claim 23.

37. A method for enhancing EUV reflection of a grazing incidence mirror, comprising:

providing at least one grazing incidence mirror, the grazing incidence mirror comprising a mirror substrate and a mirror surface layer, the mirror surface layer comprising a first layer and a second layer, the first layer being positioned between the mirror substrate and the second layer, wherein the first layer comprises a material selected from the group of Mo, Nb and combinations thereof, and the second layer comprises a material selected from the group of B, C, $B_4C$, SiC and combinations thereof; and reflecting EUV radiation at the grazing incidence mirror with a grazing incidence angle greater than 0° but equal to or less than about 21°.

38. A method according to claim 37, wherein the mirror substrate comprises the first layer.

39. A method according to claim 37, wherein the first layer has a thickness of at least about 5 nm.

40. A method according to claim 37, wherein the first layer has a thickness between about 10–100 nm.

41. A method according to claim 37, wherein the second layer has a thickness greater than 0 nm and equal to or less than about 10 nm.

42. A method according to claim 37, wherein the second layer has a thickness between about 0.1–5 nm.

43. A method according to claim 37, wherein the second layer has a thickness between about 0.5–3 nm.

44. A method according to claim 37, wherein the second layer comprises $B_4C$.

45. A method according to claim 37, wherein the first layer comprises Mo.

46. A method according to claim 37, wherein the incidence angle is larger than 0° but equal to or less than 17°.

47. A method according to claim 46, wherein the first layer comprises Nb.

* * * * *